United States Patent
Wang

(10) Patent No.: US 12,033,064 B2
(45) Date of Patent: Jul. 9, 2024

(54) NEURAL NETWORK WEIGHT MATRIX ADJUSTING METHOD, WRITING CONTROL METHOD AND RELATED APPARATUS

(71) Applicant: Hangzhou Zhicun Intelligent Technology Co., Ltd., Hangzhou (CN)

(72) Inventor: Shaodi Wang, Hangzhou (CN)

(73) Assignee: HANGZHOU ZHICUN INTELLIGENT TECHNOLOGY CO., LTD., Hangzhou (CN)

(*) Notice: Subject to any disclaimer, the term of this patent is extended or adjusted under 35 U.S.C. 154(b) by 950 days.

(21) Appl. No.: 16/921,471

(22) Filed: Jul. 6, 2020

(65) Prior Publication Data

US 2021/0256364 A1    Aug. 19, 2021

(30) Foreign Application Priority Data

Feb. 18, 2020  (CN) .......................... 202010098553.0

(51) Int. Cl.
*G06N 3/06* (2006.01)
*G06F 7/48* (2006.01)
(Continued)

(52) U.S. Cl.
CPC ............... *G06N 3/065* (2023.01); *G06F 7/48* (2013.01); *G06F 9/30134* (2013.01);
(Continued)

(58) Field of Classification Search
CPC .................................................... G06N 3/065
See application file for complete search history.

(56) References Cited

U.S. PATENT DOCUMENTS

| 10,929,746 B2* | 2/2021 | Litvak | G06F 7/5443 |
| 2016/0026912 A1* | 1/2016 | Falcon | G06N 3/045 |
| | | | 706/25 |

(Continued)

FOREIGN PATENT DOCUMENTS

| CN | 105320495 | 2/2016 |
| CN | 107994570 | 5/2018 |

(Continued)

OTHER PUBLICATIONS

Taesik Na, "On-Chip Training of Recurrent Neural Networks with Limited Numerical Precision ", IEEE, 2017 (Year: 2017).*

(Continued)

*Primary Examiner* — Van C Mang
(74) *Attorney, Agent, or Firm* — Hanley, Flight & Zimmerman, LLC

(57) ABSTRACT

The present disclosure provides a neural network weight matrix adjusting method, a writing control method and a related apparatus, The method comprises: judging whether a weight distribution of a neural network weight matrix is lower than a first preset threshold; if yes, multiplying all weight values in the neural network weight matrix by a first constant; if no, judging whether the weight distribution of the neural network weight matrix is higher than a second preset threshold, wherein the second preset threshold is greater than the first preset threshold; and dividing all weight values in the neural network weight matrix by a second constant, if the weight distribution of the neural network weight matrix is higher than the second preset threshold; wherein the first constant and the second constant are both greater than 1, thereby improving the operation precision.

7 Claims, 7 Drawing Sheets

(51) Int. Cl.
G06F 9/30 (2018.01)
G06F 17/16 (2006.01)
G06N 3/065 (2023.01)
G11C 11/407 (2006.01)
H03M 1/12 (2006.01)

(52) U.S. Cl.
CPC ............ G06F 17/16 (2013.01); G11C 11/407 (2013.01); H03M 1/12 (2013.01)

(56) References Cited

U.S. PATENT DOCUMENTS

2018/0095930 A1* 4/2018 Lu ..................... G11C 13/0002
2019/0138892 A1   5/2019 Kim et al.

FOREIGN PATENT DOCUMENTS

| CN | 108257641 | 7/2018 |
| CN | 109784483 | 5/2019 |
| CN | 109784485 | 5/2019 |
| CN | 109791626 | 5/2019 |
| CN | 110210611 | 9/2019 |
| CN | 110413255 | 11/2019 |
| CN | 110647983 | 1/2020 |
| CN | 110690902 | 1/2020 |

OTHER PUBLICATIONS

The State Intellectual Property Office of People's Republic of China, "First Office Action," issued in connection with Chinese Patent Application No. 202010098553.0, on Jun. 23, 2022, with English translation, 10 pages.

The State Intellectual Property Office of People's Republic of China, "Search Report," issued in connection with Chinese Patent Application No. 202010098553.0, on Jun. 23, 2022, with English translation, 5 pages.

Wang et al., "Overview of edge intelligent computing-in-memory chips," Micro/nano Electronics and Intelligent Manufacturing, vol. 1 No. 2, Jun. 2019, with English abstract, 11 pages.

Nandakumar et al., "A phase change memory model for neuromorphic computing," Journal of applied physics, vol. 124, No. 15, Oct. 17, 2018, 13 pages.

International Searching Authority, "Written Opinion," issued in connection with International Application No. PCT/CN2020/075648 on Nov. 20, 2020, with English Translation, 7 pages.

International Searching Authority, "International Preliminary Report on Patentability," issued in connection with International Application No. PCT/CN2020/075648 on Aug. 23, 2022, with English Translation, 10 pages.

International Searching Authority, "International Search Report," issued in connection with International Application No. PCT/CN2020/075648 on Nov. 20, 2020, 2 pages.

* cited by examiner

NEURAL NETWORK WEIGHT MATRIX ADJUSTING METHOD, WRITING CONTROL METHOD AND RELATED APPARATUS

CROSS-REFERENCE TO RELATED APPLICATION

This application claims priority to Chinese Patent Application No. 202010098553.0, filed on Feb. 18, 2020, which is hereby incorporated by reference in its entirety.

TECHNICAL FIELD

The present disclosure relates to the technical field of artificial intelligence, and particularly to a neural network weight matrix adjusting method, a writing control method and a related apparatus.

BACKGROUND ART

In order to solve the bottleneck of the traditional Von Neumann computation architecture, people have paid extensive attention to the Computer-In-Memory (CIM) chip, which has a basic idea to directly use a memory for a logical computation, thereby reducing a data transmission amount and a transmission distance between the memory and a processor, and improving the performance while reducing the power consumption.

Due to the characteristic of integration of memory and computation, the computer-in-memory chip is suitable for a neural network operation scenario. A weight matrix of a trained neural network algorithm is written into a memory cell array of the computer-in-memory chip in advance; a signal to be processed is input in parallel; based on the Ohm's Law and the Kirchhoffs Law, the signal to be processed and corresponding weight are directly subjected to vector-matrix multiply and add operations in the memory cell array; an output current/current signal of the memory cell array is quantized by an Analog-to-Digital Converter (ADC) as an output result.

In practical applications, if a weight distribution of the neural network algorithm is too small or too large (see FIG. 1 or 2, where circles represent memory cells; numbers therein represent weight values prestored therein; a value in a horizontal direction represents a row input, i.e., an input signal, e.g., in FIG. 1, an input of a first row is 7, an input of a second row is 5, and an input of a third row is 3; an arrow from top to bottom represents a output, e.g., an output of a first column is 7, an output of a second column is 7, an output of a third column is 248, and the output signal of each column is input into an ADC for converting an analog output signal of the column into a digital signal for subsequent applications; wherein FIG. 1 illustrates that the output voltages/currents of the first column and the second column are too small and exceed a lower limit range of the ADC; FIG. 2 illustrates that the output voltages/currents of three columns of memory cells are too large and exceed an upper limit range of the ADC), or an input signal is too small or too large, an analog voltage/current output value of the memory cell array may be caused to be too small or too large and exceed the lower limit range or the upper limit range of the ADC. In general, ADC has a highest quantization precision for an intermediate value, and poor quantization precisions for the values on both sides. When an input of the ADC exceeds the lower limit range or the upper limit range, corresponding output is directly truncated to a minimum or maximum value, thereby reducing the operation precision.

SUMMARY OF THE DISCLOSURE

With respect to the problems in the prior art, the present disclosure provides a neural network weight matrix adjusting method, a writing control method, a related apparatus, an electronic device and a computer readable storage medium, which can at least partially solve the problems in the prior art.

In order to achieve the above objective, the present disclosure adopts the following technical solutions:

In a first aspect, there is provided a neural network weight matrix adjusting method, comprising:
 judging whether a weight distribution of a neural network weight matrix is lower than a first preset threshold;
 if yes, multiplying all weight values in the neural network weight matrix by a first constant;
 if no, judging whether the weight distribution of the neural network weight matrix is higher than a second preset threshold, wherein the second preset threshold is greater than the first preset threshold; and
 dividing all weight values in the neural network weight matrix by a second constant, if the weight distribution of the neural network weight matrix is higher than the second preset threshold;
 wherein the first constant and the second constant are both greater than 1.

Further, after multiplying all weight values in the neural network weight matrix by a first constant, the method further comprises:
 judging whether a bit number of each weight value in the processed weight matrix exceeds a third preset threshold;
 if yes, truncating bits of each weight value exceeding the third preset threshold to obtain a first weight array and a second weight array;
 wherein the first weight array is a weight array remaining after the bits of each weight value exceeding the third preset threshold are truncated, and is stored in a memory cell array; the second weight array is a weight array obtained by truncating the bits of each weight value exceeding the third preset threshold, and is stored in another memory cell array or input into an arithmetic operation circuit.

Further, the neural network weight matrix adjusting method further comprises:
 storing the processed weight matrix into a memory cell array, if the bit number of each weight value in the processed weight matrix does not exceed the third preset threshold.

Further, the neural network weight matrix adjusting method further comprises:
 when the second weight array is stored in the another memory cell array, combining an output result of an ADC behind a memory cell array corresponding to the first weight array with an output result of an ADC behind a memory cell array corresponding to the second weight array; and
 when the second weight array is input into the arithmetic operation circuit, combining the output result of the ADC behind the memory cell array corresponding to the first weight array with an output result of the arithmetic operation circuit.

Further, dividing all weight values in the neural network weight matrix by a second constant comprises:

dividing each weight value by the second constant to obtain a third weight array;
saving overflow bits obtained after dividing each weight value by the second constant as a fourth weight array;
wherein the third weight array is stored in a memory cell array; and the fourth weight array is stored in another memory cell array or input into an arithmetic operation circuit.

Further, the neural network weight matrix adjusting method further comprises:
when the fourth weight array is stored in the another memory cell array, combining an output result of an ADC behind a memory cell array corresponding to the third weight array with an output result of an ADC behind a memory cell array corresponding to the fourth weight array; and
when the fourth weight array is input into the arithmetic operation circuit, combining the output result of the ADC behind the memory cell array corresponding to the third weight array with an output result of the arithmetic operation circuit.

In a second aspect, there is provided a neural network weight matrix writing control method, comprising:
controlling a shift register to shift each weight value input thereto according to a data adjustment instruction, and storing, in a buffer, overflow bits obtained after the shift register shifts the weight values input thereto and addresses of the weight values in a neural network weight matrix, wherein the data adjustment instruction comprises a shift direction and a shift bit number;
storing data in the buffer into a memory cell array or inputting to an arithmetic operation circuit,
wherein the data adjustment instruction is generated when a weight distribution of the neural network weight matrix is uneven; the shift register is connected to a write module; and the write module is connected to another memory cell array to write data shifted by the shift register into the another memory cell array.

Further, the neural network weight matrix writing control method further comprises:
when the data in the buffer is input into the arithmetic operation circuit, combining an output result of an ADC behind the another memory cell array with an output result of the arithmetic operation circuit; and
when the data in the buffer is input into the memory cell array, combining an output result of an ADC behind the memory cell array with the output result of an ADC behind the another memory cell array.

In a third aspect, there is provided a neural network weight matrix adjusting apparatus, comprising:
a first judgment module configured to judge whether a weight distribution of a neural network weight matrix is lower than a first preset threshold;
a weight amplification module configured to multiply all weight values in the neural network weight matrix by a first constant if the weight distribution of the neural network weight matrix is lower than the first preset threshold;
a second judgment module configured to judge whether the weight distribution of the neural network weight matrix is higher than a second preset threshold if the weight distribution of the neural network weight matrix is not lower than the first preset threshold, wherein the second preset threshold is greater than the first preset threshold; and
a weight reduction module configured to divide all weight values in the neural network weight matrix by a second constant, if the weight distribution of the neural network weight matrix is higher than the second preset threshold,
wherein the first constant and the second constant are both greater than 1.

In a fourth aspect, there is provided an electronic device, comprising a memory, a processor, and a computer program stored in the memory and executable on the processor, wherein the processor implements the steps of the neural network weight matrix adjusting method when executing the computer program.

In a fifth aspect, there is provided a computer-readable storage medium in which a computer program is stored, and when being executed by a processor, the computer program implements the steps of the neural network weight matrix adjusting method.

The present disclosure provides a neural network weight matrix adjusting method, writing control method and related apparatus, an electronic device and a computer readable storage medium, which are suitable for processing a trained neural network weight matrix before performing a neural network operation using a computer-in-memory chip. The method comprises: judging whether a weight distribution of a neural network weight matrix is lower than a first preset threshold; if yes, multiplying all weight values in the neural network weight matrix by a first constant; if no, judging whether the weight distribution of the neural network weight matrix is higher than a second preset threshold, wherein the second preset threshold is greater than the first preset threshold; and dividing all weight values in the neural network weight matrix by a second constant, if the weight distribution of the neural network weight matrix is higher than the second preset threshold; wherein the first constant and the second constant are both greater than 1. By increasing or reducing the neural network weight matrix with an uneven overall distribution in multiples, a signal obtained after the memory cell array storing the processed weight matrix performs a computation-in-memory is within an effective range of an ADC (the ADC is provided behind the memory cell array to convert the output of each memory cell column into a digital signal), thereby improving the operation precision.

In order that the above and other objectives, features and advantages of the present disclosure can be more clearly understood, the following gives detailed descriptions of the preferred embodiments with reference to the drawings.

BRIEF DESCRIPTION OF THE DRAWINGS

In order to more clearly explain the technical solutions in the embodiments of the present disclosure or in the prior art, the drawings to be used in the description of the embodiments or the prior art will be briefly introduced as follows. Obviously, the drawings in the following description just illustrate some embodiments of the present disclosure, and those of ordinary skill in the art can obtain other drawings from them without creative efforts. In which.

DETAILED DESCRIPTION OF THE PREFERRED EMBODIMENTS

In order to enable those skilled in the art to better understand the technical solutions of the present disclosure, the technical solutions in the embodiments of the present disclosure will be clearly and comprehensively described in the following with reference to the drawings. It is apparent that the embodiments as described are merely some, rather than all, of the embodiments of the present disclosure. Any other embodiment obtained by those skilled in the art based on one or more embodiments of the present disclosure without creative efforts should fall within the protection scope of the present disclosure.

Those skilled in the art should appreciate that any embodiment of the present disclosure can be provided as a method, a system or a computer program product. Therefore, the present disclosure can take the form of a full hardware embodiment, a full software embodiment, or an embodiment combining software and hardware. Moreover, the present disclosure can take the form of a computer program product implemented on one or more computer usable storage mediums (including, but not limited to, a magnetic disc memory, a CD-ROM, an optical storage, etc.) containing therein computer usable program codes.

It should be noted that the term "comprise", "have" or any other variant in the Description, claims and drawings of the present disclosure is intended to cover the non-exclusive inclusions. For example, a process, a method, a system, a product or a device comprising a series of steps or units is not necessarily limited to those steps or units clearly listed, but may comprise other steps or units not clearly listed or inherent to those processes, methods, products or devices.

It should be noted that the embodiments in the present disclosure and the features in the embodiments may be combined with each other if there is no conflict. Hereinafter, the present disclosure will be described in detail with reference to the drawings and in conjunction with the embodiments.

Figure 1:
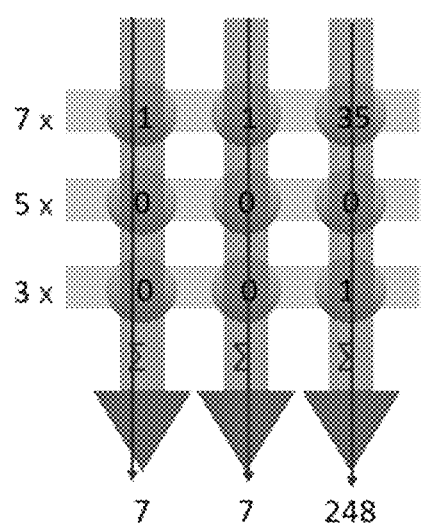
FIG. 1 illustrates that an output current/voltage of a memory cell column is too small and exceeds a lower limit range of an ADC when a matrix operation is performed in a memory cell array of a computer-in-memory chip.
Figure 2:
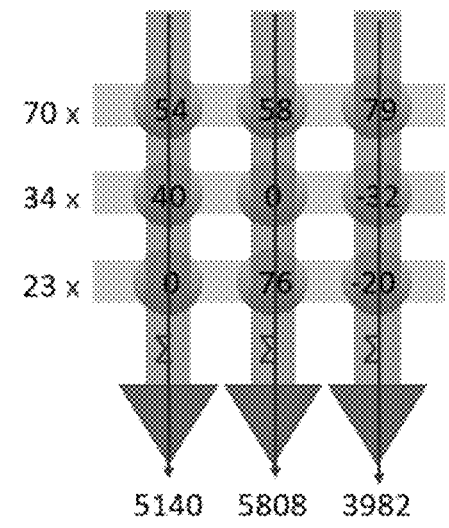
FIG. 2 illustrates that an output current/voltage of a memory cell column is too large and exceeds an upper limit range of an ADC when a matrix operation is performed in a memory cell array of a computer-in-memory chip.
Figure 3:
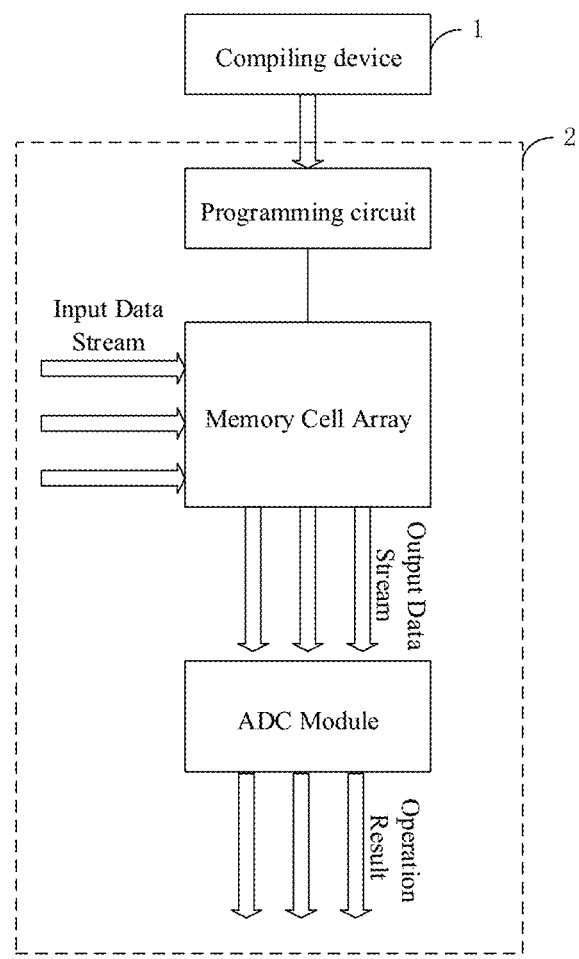
FIG. 3 illustrates an application scenario of a neural network weight matrix adjusting method according to an embodiment of the present disclosure.

FIG. 3 illustrates an application scenario of a neural network weight matrix adjusting method according to an embodiment of the present disclosure. As illustrated in FIG. 3, a compiling device 1 is connected to a programming circuit in a computer-in-memory chip 2 to write a neural network weight matrix adjusted in a neural network weight matrix adjusting method according to an embodiment of the present disclosure into a memory cell array in the computer-in-memory chip 2 through the programming circuit. When the neural network is applied to process input data, an input data stream is transmitted to the memory cell array after certain preprocessing, and is subjected to a neural network operation with a neural network weight matrix written in advance in the memory cell array. An output data stream of the memory cell array is converted into digital signals through an ADC module to output an operation result.

It should be noted that only a few circuit modules in the computer-in-memory chip 2 are exemplarily listed in FIG. 3. Those skilled in the art can understand that the computer-in-memory chip 2 may also be provided with relevant functional circuits such as a register, a post-processing module, etc. In addition, those skilled in the art can understand that the programming circuit may also be referred to as a write module or a read-write module for programming (or called as data writing) each memory cell in the memory cell array (which may be implemented with a programmable semiconductor device, such as a floating gate MOS transistor).

The compiling device may be compiling and processing device that has been or has not developed at present, or a programmed computer program that can be executed in a computer device, a processing chip or a mobile portable device, which is not limited in the embodiment of the present disclosure.

In addition, the programming circuit may be provided in the computer-in-memory chip on a reprogrammable application occasion. But on an application occasion that does not require adjusting the neural network weight matrix, the programming circuit may not be provided in the computer-in-memory chip in order to reduce the volume of the chip, and instead, the adjusted final neural network weight matrix is written into the computer-in-memory chip through a programming device in advance at the factory.

Figure 4:
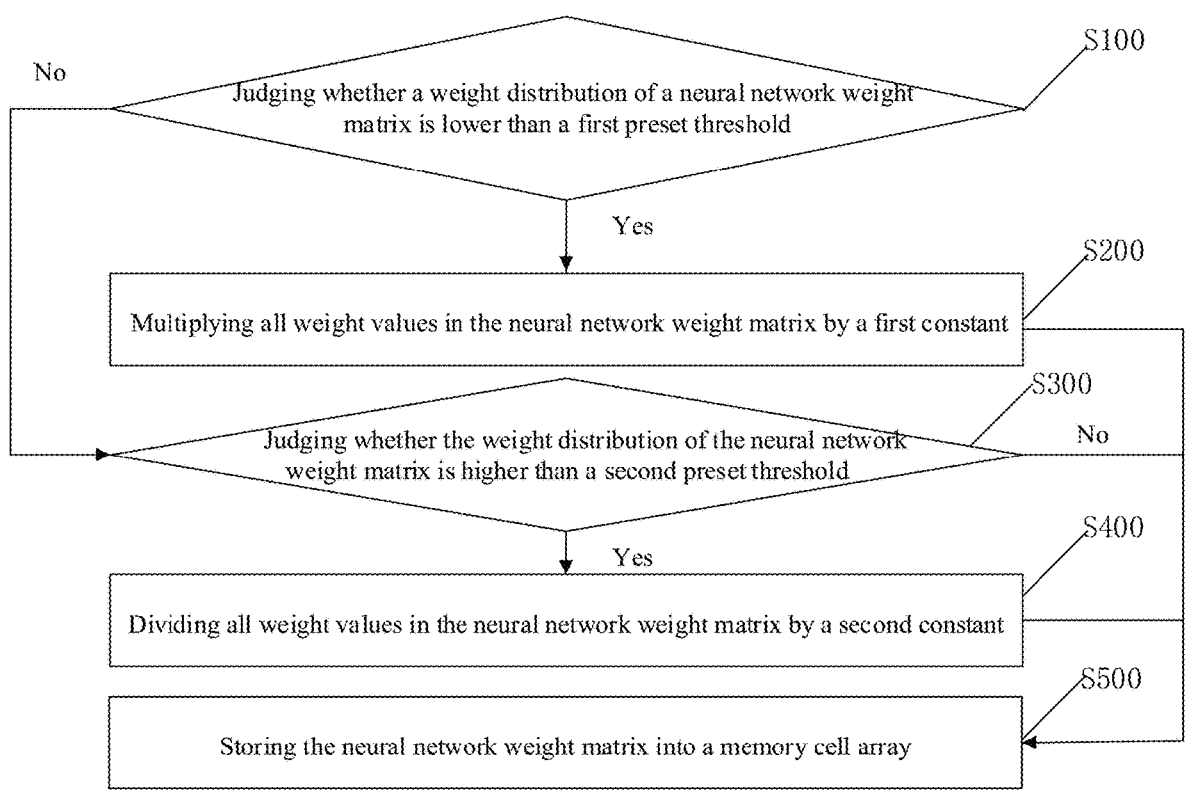
FIG. 4 illustrates Flowchart 1 of a neural network weight matrix adjusting method according to an embodiment of the present disclosure.

FIG. 4 is Flowchart 1 of a neural network weight matrix adjusting method according to an embodiment of the present disclosure. As illustrated in FIG. 4, the neural network weight matrix adjusting method may comprise:

Step S100: judging whether a weight distribution of a neural network weight matrix is lower than a first preset threshold;

if yes, performing step S200; and if no, performing step S300.

Wherein the neural network weight matrix is a neural network weight matrix trained in a neural network training stage, and the weight distribution may be statistical indicators such as a mean value or a probability distribution, which is specifically set by a designer according to the actual range of the ADC. The first preset threshold is set by the designer according to the specific statistical requirement and the hardware demand.

Step S200: multiplying all weight values in the neural network weight matrix by a first constant.

That is, all weight values in the neural network weight matrix are multiplied by a constant N to increase a network weight, and after the increased weight matrix is written into the memory cell array, the output analog current of the memory cell array can be multiplied for the same input data stream during application.

The constant N may be set as an integer multiple of 2, which is equivalent to a shift.

Figures 5, 6, 7:
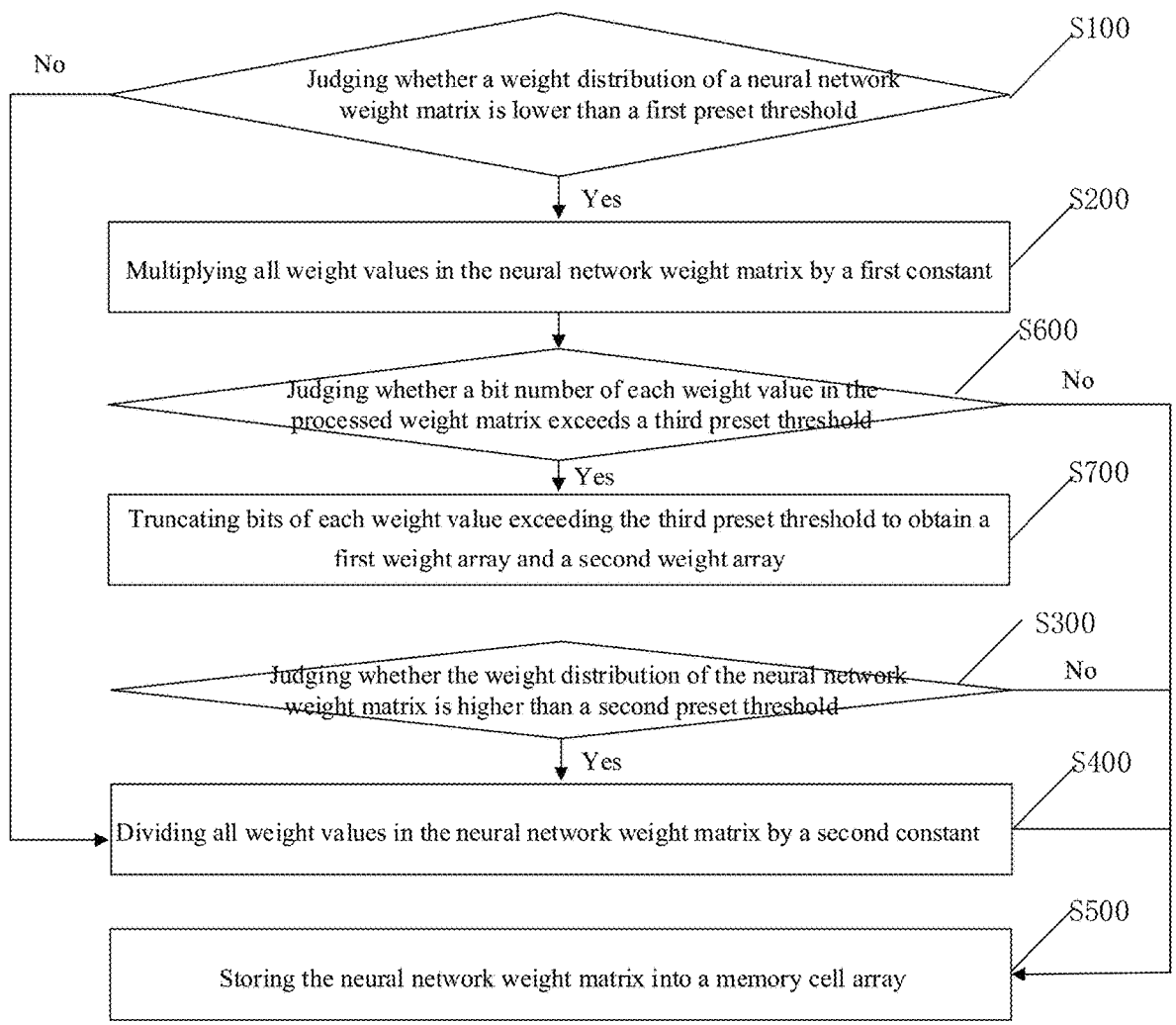
FIG. 5 illustrates a schematic diagram of a neural network weight matrix adjusting method according to an embodiment of the present disclosure.
FIG. 6 illustrates a case where a weight array adjusted using a neural network weight matrix adjusting method according to an embodiment of the present disclosure has a weight value exceeding a bit number.
FIG. 7 illustrates Flowchart 2 of a neural network weight matrix adjusting method according to an embodiment of the present disclosure.

For example, referring to FIG. 5, for a binary weight matrix, an original neural network weight matrix is multiplied by 8, i.e., binary numbers are shifted leftwards by 3 bits to obtain an amplified weight matrix.

Step S300: judging whether the weight distribution of the neural network weight matrix is higher than a second preset threshold, wherein the second preset threshold is greater than the first preset threshold; if yes, performing step S400; and if no, performing step S500.

Wherein the second preset threshold is set by a designer according to the specific statistical requirement and the hardware demand.

Step S400: dividing all weight values in the neural network weight matrix by a second constant.

Wherein the first constant and the second constant are both greater than 1, and may be the same as or different from each other. It should be noted that an operation result of multiplying by 2 is the same as an operation result of dividing by ½, therefore, the protection scope of the present disclosure is not limited to an expression of multiplying or dividing, and the same or equivalent operation processes should be included in the protection scope of the present disclosure.

That is, if the weight distribution is higher than the second preset threshold, after the weight matrix is written into the memory cell array, the analog voltage/current output by the memory cell array may exceed a quantization upper limit of the ADC in the application stage. At this time, all the weights are divided by a constant M (M is usually an integer multiple of 2, which is equivalent to shifting rightwards) to reduce the network weight, and the reduced network weight can decrease the analog voltage/current output by the memory cell array to an appropriate range of the ADC for the same input data stream in the application stage.

Step S500: storing the neural network weight matrix into a memory cell array.

The neural network weight matrix in this step refers to the neural network weight matrix in the Step S100 (if the weight distribution of the weight matrix is neither lower than the first preset threshold nor higher than the second preset threshold), or the weight matrix obtained after the processing in the Step S200 or the Step S400.

Specifically, the weight matrix is stored in a memory cell array, and an input data stream is input into the memory cell array in the application stage. In the memory cell array, the input data stream and the weight array are subjected to an analog vector-matrix multiply operation, an operation result is transmitted to an ADC behind the memory cell array in the form of an output analog voltage/current of the memory cell array, and the ADC converts the analog voltage/current into a digital signal.

To sum up, the neural network weight matrix adjusting method according to the embodiment of the present disclosure increases or reduces the neural network weight matrix with an uneven overall distribution in multiples, so that a signal obtained after the memory cell array storing the processed weight matrix performs a computation-in-memory is within an effective range of the ADC (the ADC is provided behind the memory cell array to convert the output of each memory cell column into a digital signal), thereby improving the operation precision.

It should be noted that for the Step S200 of multiplying all weight values in the neural network weight matrix by a first constant in order to increase the network weight, ideally all the weight values in the increased weight array meet the requirement. But those skilled in the art can understand that for an array with an uneven weight distribution, some large weight values may exceed an upper limit of bit number in the increased weight array (i.e., there are overflow bits after a shift). For example, referring to FIG. 6, assuming the weight precision to be 8 bits, and after the weight array is multiplied by a constant of 8 (shifted leftwards by 3 bits), a weight value in a third row and a second column will exceed the upper limit of bit number. In this case, referring to FIG. 7, the neural network weight matrix adjusting method according to the embodiment of the present disclosure may further comprise:

Step S600: judging whether a bit number of each weight value in the processed weight matrix exceeds a third preset threshold;
   if yes, performing Step S700; and if no, performing the Step S500.

Wherein the third preset threshold may be a bit number of the algorithm precision, such as 8 bits, 16 bits, etc., which is set by a designer according to the specific statistical requirement and the hardware demand.

Step S700: truncating bits of each weight value exceeding the third preset threshold to obtain a first weight array and a second weight array.
   wherein the first weight array (also referred to as a standard matrix) is a weight array remaining after the bits of each weight value exceeding the third preset threshold are truncated, and is stored in the memory cell array of the computer-in-memory chip to perform an analog vector-matrix multiply operation; the second weight array is a weight array obtained by truncating the bits of each weight value exceeding the third preset threshold, and is stored in another memory cell array or input into an arithmetic operation circuit. It should be noted that the second weight array may be a sparse matrix or a common weight matrix.

The sparse matrix may be input into an arithmetic operation circuit to perform an operation, wherein one input corresponding to the operation is an element in the sparse matrix, and the other input is input data corresponding to a weight value corresponding to the element in the input data stream.

For example, the arithmetic operation circuit may be a conventional digital circuit such as a multiplier or a CPU. Specifically, the sparse matrix may be stored in a memory and then transferred from the memory to the CPU for a multiply operation.

When the second weight array is a common weight array, the weight array may be stored in another memory cell array which performs an analog vector-matrix multiply operation on the second weight array and the input data stream.

It should be noted that during truncating, the address of the data should be recorded correspondingly, so as to select corresponding input data when the operation is performed on the matrix obtained by truncating.

Figure 8:
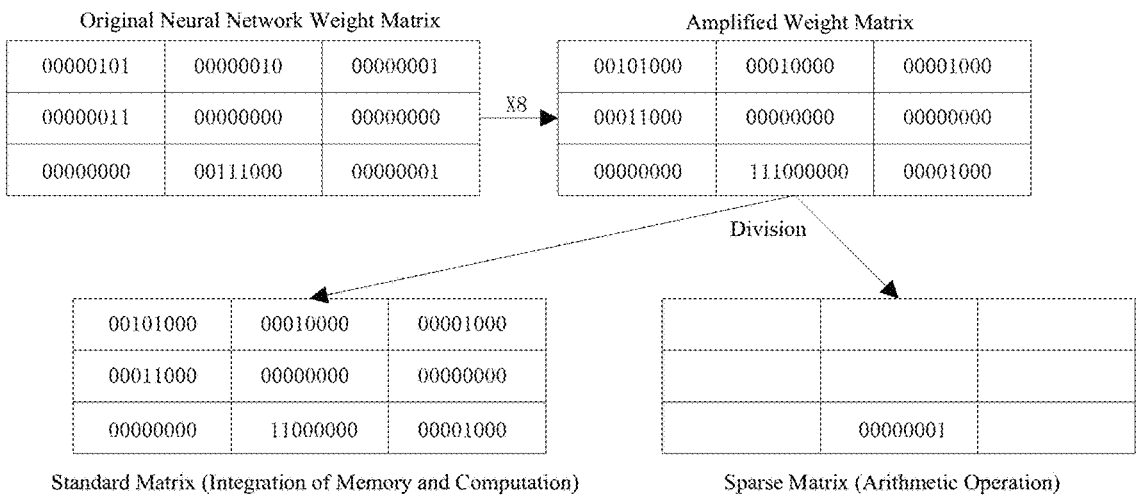
FIG. 8 illustrates a schematic diagram of dividing a weight array after amplifying the weight array according to an embodiment of the present disclosure.

FIG. 8 illustrates a schematic diagram of dividing a weight array after amplifying the weight array according to an embodiment of the present disclosure. As illustrated in FIG. 8, corresponding to the situation that the bit number is exceeded as illustrated in FIG. 6, a portion more than 8 bits is truncated and placed into a new weight matrix which is a sparse matrix. The standard matrix is still processed based on the integration of storage and computation (a vector-matrix multiply operation), the sparse matrix may be processed by a conventional digital circuit, and the standard matrix and the sparse matrix are combined as a final output.

Figure 9:
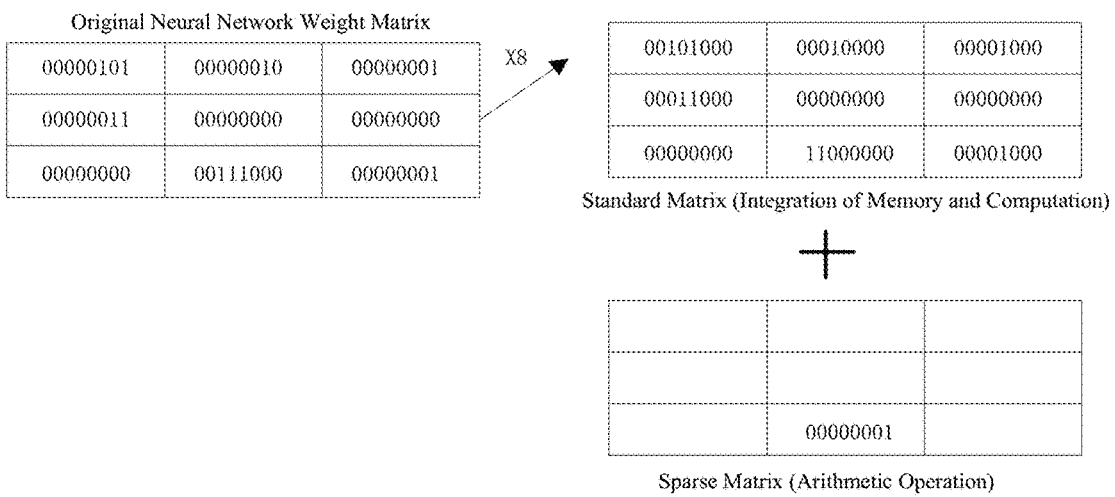
FIG. 9 illustrates another schematic diagram of dividing a weight array after amplifying the weight array according to an embodiment of the present disclosure.

FIG. 8 detailedly illustrates the principle of the embodiment of the present disclosure in steps. During actual implementation, in order to effectively save the procedures, as illustrated in FIG. 9, the overflow bits may be directly stored in another matrix while increasing the weight, without distinguishing the increasing step and the dividing step.

In an alternative embodiment, the adjusting method may further comprise:
when the second weight array is stored in the another memory cell array, combining an output result of an ADC behind a memory cell array corresponding to the first weight array with an output result of an ADC behind a memory cell array corresponding to the second weight array; and
when the second weight array is input into the arithmetic operation circuit, combining the output result of the ADC behind the memory cell array corresponding to the first weight array with an output result of the arithmetic operation circuit.

Those skilled in the art can understand that the combination may be superposing the results of the first weight array and the second weight array, or reducing a superposed result by a certain multiple based on the superposition, which may be specifically selected according to the parameters such as the subsequent circuit quantization precision.

Figure 10:
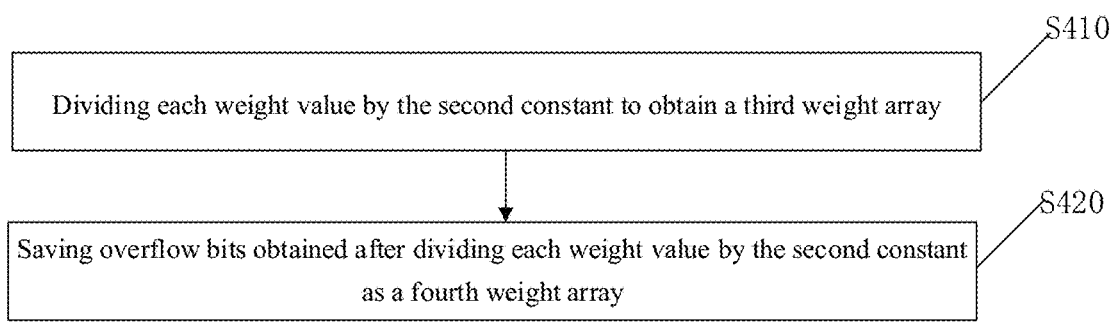
FIG. 10 illustrates specific steps of Step S400 according to an embodiment of the present disclosure.

In an alternative embodiment, for the Step S400 of dividing all weight values in the neural network weight matrix by a second constant in order to reduce the network weight, ideally all the weight values in the reduced weight array meet the requirement. But those skilled in the art can understand that for an array with an uneven weight distribution, overflow bits may occur after some weight values in the reduced weight array are shifted rightwards. In this case, referring to FIG. 10, the Step S400 may comprise:

Step S410: dividing each weight value by the second constant to obtain a third weight array.

Step S420: saving overflow bits obtained after dividing each weight value by the second constant as a fourth weight array.

Wherein the third weight array is stored in a memory cell array to perform an analog vector-matrix multiply operation; the fourth weight array is stored in another memory cell array or input into an arithmetic operation circuit. For the operation of the fourth weight array, please refer to the operation of the second weight array, which will not be repeated here.

Specifically, dividing each weight value by the second constant is equivalent to shifting rightwards, and the overflow bits are saved as the fourth weight array.

It should be noted that during shifting or saving the overflow bits as a matrix, the address of the data (i.e., the address in the matrix) should be recorded correspondingly, so as to select corresponding input data when the operation is performed on the matrix obtained by truncating.

Figure 11:
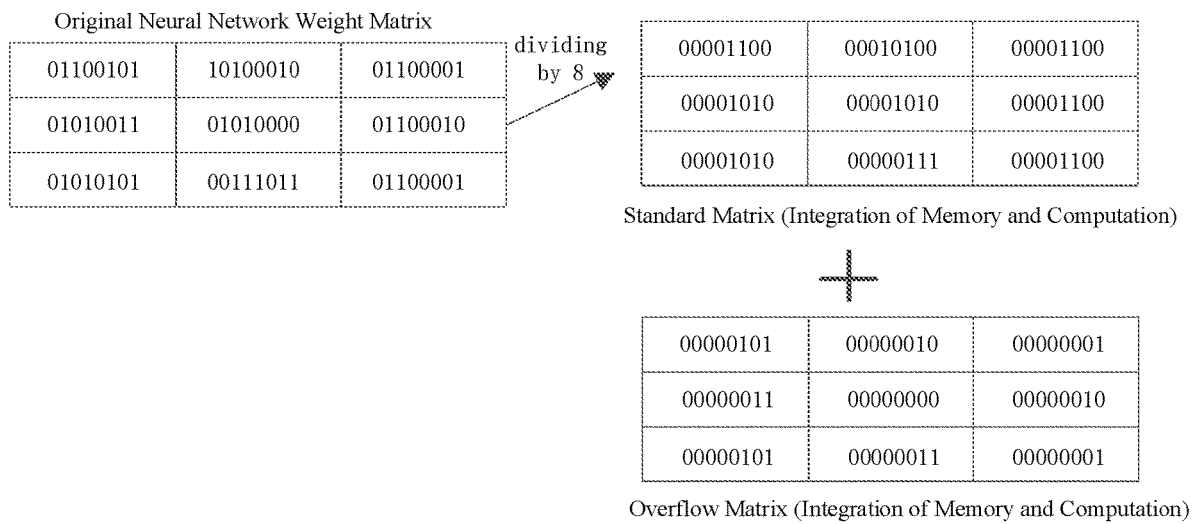
FIG. 11 illustrates a schematic diagram of dividing a weight array after reducing the weight array according to an embodiment of the present disclosure.

FIG. 11 illustrates a schematic diagram of dividing a weight array after reducing the weight array according to an embodiment of the present disclosure. As illustrated in FIG. 11, dividing each weight value in an original neural network weight matrix by 8 is equivalent to shifting each binary weight value rightwards by 3 bits to obtain a standard matrix, and saving overflow bits as an overflow matrix. Since neither the standard matrix nor the overflow matrix obtained after the shifting as illustrated is a sparse matrix, the standard matrix and the overflow matrix may be processed with two memory cell arrays, respectively. The input data streams of the two memory cell arrays are the same, and the outputs of the two memory cell arrays are combined and then input into the ADC for a conversion.

It should be noted that if the weight distribution of the new matrix (e.g., the standard matrix, the sparse matrix or the overflow matrix illustrated in FIG. 8, 9 or 11) generated after adjustment is uneven, the adjusting method according the embodiment of the present disclosure may be continued for adjustment until the weight distribution of the matrix is appropriate. For example, if the weight of the new matrix generated after adjustment is small, it may be multiplied by a constant to be adjusted to an appropriate distribution.

In a further embodiment, the neural network weight matrix adjusting method further comprises:
when the fourth weight array is stored in the another memory cell array, combining an output result of an ADC behind a memory cell array corresponding to the third weight array with an output result of an ADC behind a memory cell array corresponding to the fourth weight array.
when the fourth weight array is input into the arithmetic operation circuit, combining the output result of the ADC behind the memory cell array corresponding to the third weight array with an output result of the arithmetic operation circuit.

Those skilled in the art can understand that the combination may be superposing the results of the third weight array and the fourth weight array, or increasing a superposed result by a certain multiple based on the superposition, which may be specifically selected according to the parameters such as the subsequent circuit quantization precision.

To sum up, the neural network weight matrix adjusting method according to the embodiment of the present disclosure increases or reduces the neural network weight matrix with an uneven overall distribution in multiples, so that a signal obtained after the memory cell array storing the processed weight matrix performs a computation-in-memory is within an effective range of the ADC (the ADC is provided behind the memory cell array to convert the output of each memory cell column into a digital signal), thereby improving the operation precision.

Based on the same inventive concept, the embodiments of the present disclosure further provide a neural network weight matrix adjusting apparatus as described in the following embodiments, which can be used to implement the method described in the above embodiments. Since the principle for the neural network weight matrix adjusting apparatus to solve the problem is similar to the above method, the implementation of the neural network weight matrix adjusting apparatus may refer to the implementation of the above method, and the repeated content will be omitted. As used below, the term "unit" or "module" may be a combination of software and/or hardware that realizes a predetermined function. Although the apparatus described in the following embodiments is preferably implemented by software, an implementation by hardware or a combination of software and hardware is also possible and conceived.

Figure 12:
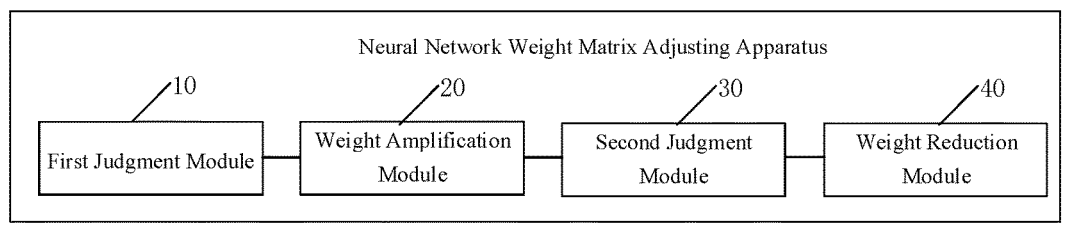
FIG. 12 is a structural block diagram of a neural network weight matrix adjusting apparatus according to an embodiment of the present disclosure.

FIG. 12 is a structural block diagram of a neural network weight matrix adjusting apparatus according to an embodiment of the present disclosure. As illustrated in FIG. 12, the neural network weight matrix adjusting apparatus may comprise a first judgment module 10, a weight amplification module 20, a second judgment module 30, and a weight reduction module 40.

The first judgment module 10 is configured to judge whether a weight distribution of a neural network weight matrix is lower than a first preset threshold.

The weight amplification module 20 is configured to multiply all weight values in the neural network weight matrix by a first constant if the weight distribution of the neural network weight matrix is lower than the first preset threshold.

The second judgment module 30 is configured to judge whether the weight distribution of the neural network weight matrix is higher than a second preset threshold if the weight distribution of the neural network weight matrix is not lower than the first preset threshold, wherein the second preset threshold is greater than the first preset threshold.

The weight reduction module 40 is configured to divide all weight values in the neural network weight matrix by a second constant if the weight distribution of the neural network weight matrix is higher than the second preset threshold.

Wherein the first constant and the second constant are both greater than 1.

Figures 13, 14:
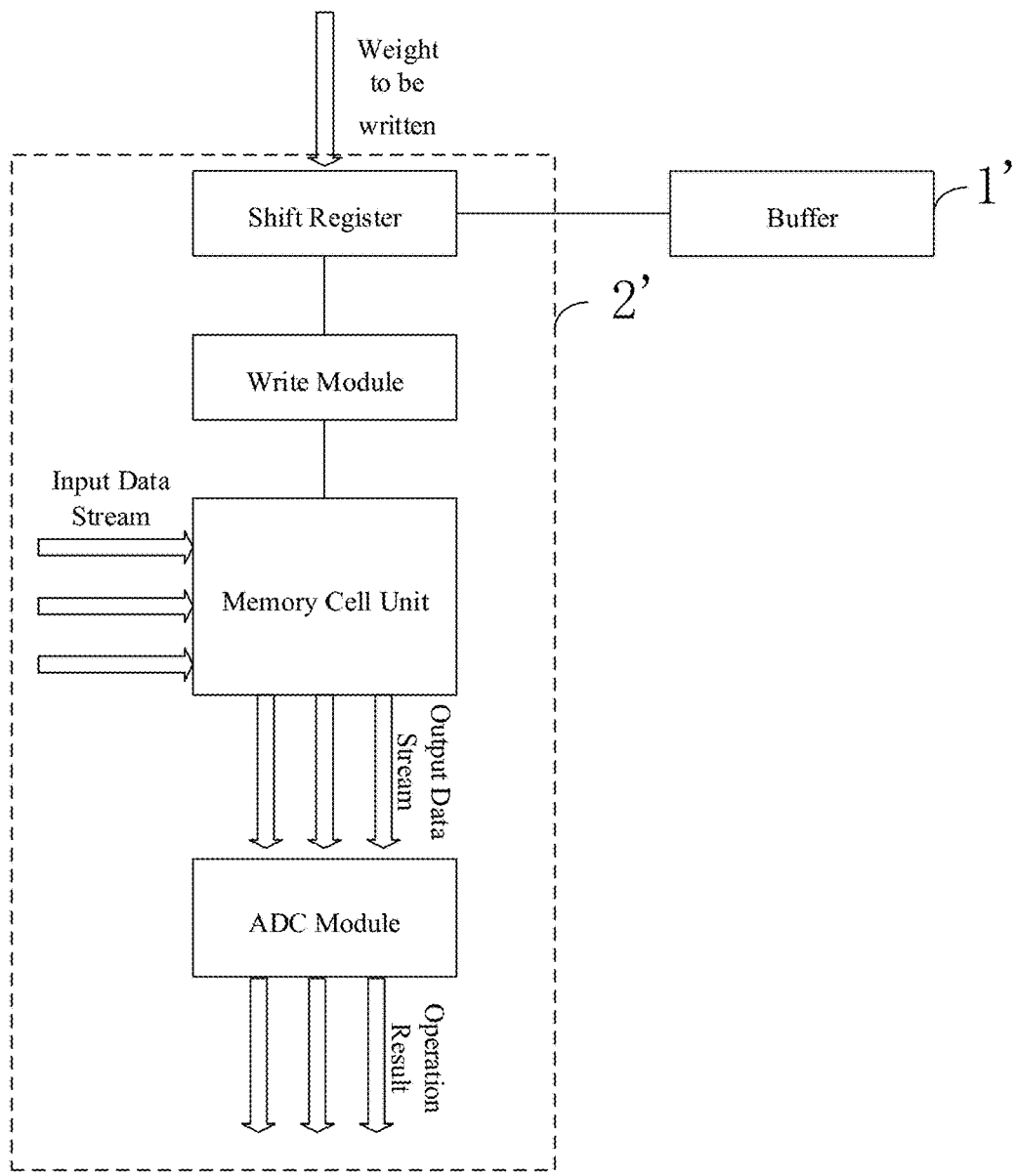
FIG. 13 illustrates an application scenario of a neural network weight matrix writing control method according to an embodiment of the present disclosure.
FIG. 14 is a flowchart of a neural network weight matrix writing control method according to an embodiment of the present disclosure.

The embodiments of the present disclosure further provide a neural network weight matrix writing control method. FIG. 13 illustrates an application scenario of a neural network weight matrix writing control method according to an embodiment of the present disclosure. As illustrated in FIG. 13, in this scenario, a weight to be written is input into a shift register in a computer-in-memory chip 2', shifted by the shift register, and written into a memory cell corresponding to a memory cell array by a write module. When the neural network is applied to process input data, an input data stream is transmitted to the memory cell array after certain preprocessing, and is subjected to a neural network operation with a neural network weight matrix written in advance in the memory cell array. An output data stream of the memory cell array is converted into digital signals through the ADC module to output an operation result.

It should be noted that only a few circuit modules in the computer-in-memory chip 2' are exemplarily listed in FIG. 13. Those skilled in the art can understand that the computer-in-memory chip 2' may also be provided with relevant functional circuits such as a register, a post-processing module, etc. In addition, each memory cell in the memory cell array may be implemented with a programmable semiconductor device, such as a floating gate MOS transistor.

In addition, the shift register is further connected to an off-chip buffer 1' for buffering data.

In which, the neural network weight matrix writing control method according to the embodiment of the present disclosure is performed by a control module. Referring to FIG. 14, the neural network weight matrix writing control method may comprise:

Step S1000: controlling a shift register to shift each weight value input thereto according to a data adjustment instruction, and storing, in a buffer, overflow bits obtained after the shift register shifts the weight values input thereto and addresses of the weight values in a neural network weight matrix.

Wherein the data adjustment instruction comprises a shift direction and a shift bit number.

Specifically, it may be judged in advance whether the weight distribution of the neural network weight matrix is lower than a first preset threshold or higher than a second preset threshold, and if yes, the data adjustment instruction is generated.

In addition, the neural network weight matrix is a neural network weight matrix trained in a neural network training stage, and the weight distribution may be statistical indicators such as a mean value or a probability distribution. The first preset threshold and the second preset threshold are set by a designer according to the specific statistical requirement and the hardware demand, wherein the second preset threshold is greater than the first preset threshold.

If the weight distribution of the neural network weight matrix is lower than the first preset threshold, the shift direction in the data adjustment instruction is shifting leftwards to increase the network weight, and after the increased weight matrix is written into the memory cell array, the output analog current of the memory cell array can be increased in multiples for the same input data stream during application, and the shift bit number is set by the designer according to the specific statistical requirement and the hardware demand. If the weight distribution of the neural network weight matrix is higher than the second preset threshold, the shift direction in the data adjustment instruction is shifting rightwards to reduce the network weight, so that the reduced network weight can decrease the analog voltage/current output by the memory cell array to an appropriate range of the ADC for the same input data stream in the application stage. The shift bit number is set by the designer according to the specific statistical requirement and the hardware demand.

It should be noted that the array obtained after the shift operation serves as a standard matrix, the memory cell array performs a neural network operation, and the overflow bits after the shift and the addresses of the weight values in the neural network weight matrix are saved as an array, which may be a sparse matrix or a common weight array, and stored in a buffer.

Step S2000: storing data in the buffer into a memory cell array or inputting to an arithmetic operation circuit.

Specifically, when the data in the buffer is a sparse matrix, it is input into an arithmetic operation circuit to perform an operation, and when the data in the buffer is a common weight matrix, it is input into a memory cell array for processing. For details, please refer to the processing procedure of the second weight array, which will not be repeated here.

In which, the data adjustment instruction is generated when the weight distribution of the neural network weight matrix is uneven; the shift register is connected to a write module; and the write module is connected to another memory cell array to write data shifted by the shift register into the another memory cell array.

The neural network weight matrix writing control method according to the embodiment of the present disclosure adopts the shift register to increase or reduce the neural network weight matrix with an uneven overall distribution in multiples in the weight writing process, so that a signal obtained after the memory cell array storing the processed weight matrix performs a computation-in-memory is within an effective range of the ADC (the ADC is provided behind the memory cell array to convert the output of each memory cell column into a digital signal), thereby improving the operation precision.

In an alternative embodiment, the neural network weight matrix writing control method further comprises:

when the data in the buffer is input into the arithmetic operation circuit, combining an output result of an ADC behind the another memory cell array with an output result of the arithmetic operation circuit; and when the data in the buffer is input into the memory cell array, combining an output result of an ADC behind the memory cell array with the output result of the ADC behind the another memory cell array.

Those skilled in the art can understand that the combination may be superposing the results of two memory cell arrays or one memory cell array and one arithmetic operation circuit, or reducing a superposed result by a certain multiple based on the superposition, which may be specifically selected according to the parameters such as the subsequent circuit quantization precision.

The apparatus set forth in the above embodiments specifically may be implemented by a computer chip or an entity, or by a product having a certain function. A typical implementation device is an electronic device, and specifically, the electronic device may be, for example, a personal computer, a laptop computer, a cellular phone, a camera phone, a smart phone, a personal digital assistant, a media player, a navigation device, an email device, a game console, a tablet computer, a wearable device, or combinations thereof.

In a typical example, the electronic device specifically comprises a memory, a processor, and a computer program stored in the memory and executable on the processor, wherein the processor implements the following steps when executing the program:

judging whether a weight distribution of a neural network weight matrix is lower than a first preset threshold.

if yes, multiplying all weight values in the neural network weight matrix by a first constant.

if no, judging whether the weight distribution of the neural network weight matrix is higher than a second preset threshold, wherein the second preset threshold is greater than the first preset threshold.

dividing all weight values in the neural network weight matrix by a second constant, if the weight distribution of the neural network weight matrix is higher than the second preset threshold, wherein the first constant and the second constant are both greater than 1.

As can be seen from the above description, the electronic equipment according to the embodiment of the present disclosure may be adopted to adjust the neural network weight matrix, and the neural network weight matrix with an uneven overall distribution is increased or reduced in multiples, so that a signal obtained after the memory cell array storing the processed weight matrix performs a computation-in-memory is within an effective range of the ADC (the ADC is provided behind the memory cell array to convert the output of each memory cell column into a digital signal), thereby improving the operation precision.

Figure 15:
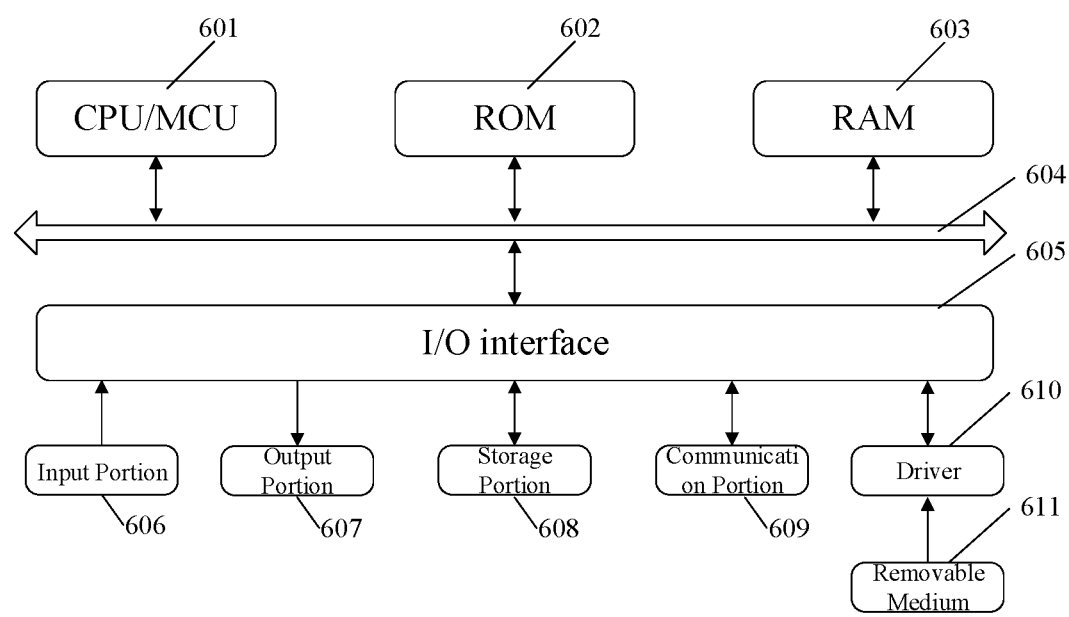
FIG. 15 is a structural diagram of an electronic device according to an embodiment of the present disclosure.

Next, referring to FIG. 15, which illustrates a structural diagram of an electronic device 600 suitable for implementing an embodiment of the present disclosure.

As illustrated in FIG. 15, the electronic device 600 comprises a central processing unit (CPU)/MCU 601 which may perform various appropriate works and processing according to a program stored in a read-only memory (ROM) 602 or a program loaded from a storage portion 608 into a random access memory (RAM) 603. In the RAM 603, various programs and data required for operations of a system 600 are also stored. The CPU 601, the ROM 602, and the RAM 603 are connected to each other through a bus 604. An input/output (I/O) interface 605 is also connected to the bus 604.

The following components are connected to the I/O interface 605: an input portion 606 including a keyboard, a mouse, etc.; an output portion 607 including a cathode ray tube (CRT), a liquid crystal display (LCD), a speaker, etc.; a storage portion 608 including a hard disk, etc.; and a communication portion 609 including a network interface card such as an LAN card, a modem, etc. The communication portion 609 performs communication processing via a network such as the Internet. A driver 610 is also connected to the I/O interface 605 as needed. A removable medium 611, such as a magnetic disk, an optical disk, a magneto-optical disk, a semiconductor memory, etc., is installed on the driver 610 as needed, so that a computer program read therefrom can be installed in the storage portion 608 as needed.

In particular, according to an embodiment of the present disclosure, the procedure described above with reference to the flowchart may be implemented as a computer software program. For example, an embodiment of the present disclosure comprises a computer-readable storage medium in which a computer program is stored, and when being executed by a processor, the computer program implements the steps of:

judging whether a weight distribution of a neural network weight matrix is lower than a first preset threshold;

if yes, multiplying all weight values in the neural network weight matrix by a first constant;

if no, judging whether the weight distribution of the neural network weight matrix is higher than a second preset threshold, wherein the second preset threshold is greater than the first preset threshold;

dividing all weight values in the neural network weight matrix by a second constant, if the weight distribution of the neural network weight matrix is higher than the second preset threshold, wherein the first constant and the second constant are both greater than 1.

As can be seen from the above description, the electronic equipment according to the embodiment of the present disclosure may be adopted to adjust the neural network weight matrix, and increase or reduce the neural network weight matrix with an uneven overall distribution in multiples, so that a signal obtained after the memory cell array storing the processed weight matrix performs a computation-in-memory is within an effective range of the ADC (the ADC is provided behind the memory cell array to convert the output of each memory cell column into a digital signal), thereby improving the operation precision.

In such an embodiment, the computer program may be downloaded and installed from the network through the communication portion 609, and/or installed from the removable medium 611.

The computer-readable medium includes permanent and non-permanent, removable and non-removable media, which can realize the information storage in any method or technique. The information can be computer readable instructions, data structures, program modules or other data. An example of the computer storage medium includes, but not limited to, a phase change memory (PRAM), a static random access memory (SRAM), a dynamic random access memory (DRAM), other types of random access memory (RAM), a read-only memory (ROM), an electrically-erasable programmable read-only memory (EEPROM), a flash memory or other memory techniques, a compact disk read only memory (CD-ROM), a digital versatile disc (DVD) or other optical storages, magnetic cassette tapes, magnetic diskettes or other magnetic storage device or any other non-transmission medium, which can be used for the storage of information accessible to a computing device. According to the definitions herein, the computer readable medium does not include any temporary computer readable media (transitory media), such as modulated data signal and carrier wave.

For the convenience of description, the above apparatus is divided into units based on functions so as to be described respectively. Of course, during implementation of the present disclosure, the functions of the units may be implemented in the same or a plurality of software and/or hardware.

The present disclosure is described with reference to a flowchart and/or a block diagram of the method, device (system) and computer program product according to the embodiments of the present disclosure. It shall be appreciated that each flow and/or block in the flowchart and/or the block diagram and a combination of flows and/or blocks in the flowchart and/or the block diagram can be realized by computer program instructions. Those computer program instructions can be provided to a general computer, a dedicated computer, an embedded processor or a processor of other programmable data processing device to produce a machine, so that the instructions executed by the processor of the computer or other programmable data processing device produce means for realizing specified functions in one or more flows in the flowchart and/or one or more blocks in the block diagram.

These computer program instructions may also be stored in a computer readable memory capable of guiding the computer or other programmable data processing devices to work in a particular manner, so that the instructions stored in the computer readable memory can produce manufacture articles including an instructing device which realizes function(s) specified in one or more flows in the flowchart and/or one or more blocks in the block diagram.

These computer program instructions may also be loaded onto the computer or other programmable data processing devices, so that a series of operation steps are performed on the computer or other programmable data processing devices to produce a processing realized by the computer, thus the instructions executed on the computer or other programmable devices provide step(s) for realizing function(s) specified in one or more flows in the flowchart and/or one or more blocks in the block diagram.

Further to be noted, the term "comprise", "include" or any other variant intends to cover the non-exclusive inclusions, so that a process, a method, a commodity or a device comprising a series of elements comprise not only those elements, but also other elements not explicitly listed, or further comprise inherent elements of such process, method, commodity or device. In a case where there is no further limitation, the elements defined by a sentence "comprising a . . . " do not exclude other identical elements existing in the process, method, commodity or device comprising the elements.

Those skilled in the art should appreciate that any embodiment of the present application can be provided as a method, a system or a computer program product. Therefore, the present application can take the form of a full hardware embodiment, a full software embodiment, or an embodiment combining software and hardware. Moreover, the present invention can take the form of a computer program product implemented on one or more computer usable storage mediums (including, but not limited to, a magnetic disc memory, CD-ROM, optical storage, etc.) containing therein computer usable program codes.

The present application may be described in the general context of computer executable instructions executed by the computer, e.g., the program module. In general, the program module includes routine, program, object, component, data structure, etc. executing a particular task or realizing a particular abstract data type. The present application may also be put into practice in the distributed computing environments where tasks are executed by remote processing devices connected through a communication network. In the distributed computing environments, the program modules may be located in the local and remote computer storage medium including the storage device.

The embodiments herein are all described in a progressive manner, and the same or similar portions of the embodiments can refer to each other. Each embodiment lays an emphasis on its distinctions from other embodiments. In particular, the system embodiment is simply described since it is substantially similar to the method embodiment, and please refer to the descriptions of the method embodiment for the relevant portion.

The above descriptions involve merely some embodiments of the present disclosure, and are not intended to limit the present disclosure. Various modifications and variations may be made to the embodiments of the present disclosure by those skilled in the art. Any modification, equivalent substitution, improvement, and the like made within the spirit and principle of the present disclosure should fall within the scope of the appended claims.

The invention claimed is:

1. A neural network weight matrix adjusting method, comprising:
   judging whether a weight distribution of a neural network weight matrix is lower than a first preset threshold;
   if yes, multiplying all weight values in the neural network weight matrix by a first constant;
   if no, judging whether the weight distribution of the neural network weight matrix is higher than a second preset threshold, wherein the second preset threshold is greater than the first preset threshold; and
   dividing all weight values in the neural network weight matrix by a second constant, if the weight distribution of the neural network weight matrix is higher than the second preset threshold;
   wherein the first constant and the second constant are both greater than 1;
   increasing or reducing the neural network weight matrix in multiples, so that a signal obtained after a memory cell array storing the weight matrix performs a computation-in-memory is within an effective range of an Analog-to-Digital Converter (ADC);
   after multiplying all weight values in the neural network weight matrix by a first constant:
      judging whether a bit number of each weight value in the weight matrix exceeds a third preset threshold;
      if yes, truncating bits of each weight value exceeding the third preset threshold to obtain a first weight array and a second weight array;
      wherein the first weight array is a weight array remaining after the bits of each weight value exceeding the third preset threshold are truncated, and is stored in the memory cell array; the second weight array is a weight array obtained by truncating the bits of each weight value exceeding the third preset threshold, and is stored in another memory cell array or input into an arithmetic operation circuit;

when the second weight array is stored in the another memory cell array, combining an output result of the ADC behind the memory cell array corresponding to the first weight array with an output result of another ADC behind another memory cell array corresponding to the second weight array; and when the second weight array is input into the arithmetic operation circuit, combining the output result of the ADC behind the memory cell array corresponding to the first weight array with an output result of the arithmetic operation circuit.

2. The neural network weight matrix adjusting method according to claim 1, further comprising:

storing the processed weight matrix into a memory cell array, if the bit number of each weight value in the processed weight matrix does not exceed the third preset threshold.

3. The neural network weight matrix adjusting method according to claim 1, wherein dividing all weight values in the neural network weight matrix by a second constant comprises:

dividing each weight value by the second constant to obtain a third weight array;

saving overflow bits obtained after dividing each weight value by the second constant as a fourth weight array;

wherein the third weight array is stored in a memory cell array; and the fourth weight array is stored in another memory cell array or input into an arithmetic operation circuit.

4. The neural network weight matrix adjusting method according to claim 3, further comprising:

when the fourth weight array is stored in the another memory cell array, combining an output result of an ADC behind a memory cell array corresponding to the third weight array with an output result of an ADC behind a memory cell array corresponding to the fourth weight array; and when the fourth weight array is input into the arithmetic operation circuit, combining the output result of the ADC behind the memory cell array corresponding to the third weight array with an output result of the arithmetic operation circuit.

5. A neural network weight matrix writing control method, comprising:

controlling a shift register to shift each weight value input thereto according to a data adjustment instruction, and storing, in a buffer, overflow bits obtained after the shift register shifts the weight values input thereto and addresses of the weight values in a neural network weight matrix, wherein the data adjustment instruction comprises a shift direction and a shift bit number;

storing data in the buffer into a memory cell array or inputting to an arithmetic operation circuit, wherein the data adjustment instruction is generated when a weight distribution of the neural network weight matrix is lower than a first preset threshold or the weight distribution of the neural network weight matrix is higher than a second preset threshold; the shift register is connected to a write module; and the write module is connected to another memory cell array to write data shifted by the shift register into the another memory cell array;

when a second weight array is stored in the another memory cell array, combining an output result of an ADC behind a memory cell array corresponding to a first weight array with an output result of an ADC behind a memory cell array corresponding to a second weight array; and when the second weight array is input into the arithmetic operation circuit, combining the output result of the ADC behind the memory cell array corresponding to the first weight array with an output result of the arithmetic operation circuit.

6. The neural network weight matrix writing control method according to claim 5, further comprising:

when the data in the buffer is input into the arithmetic operation circuit, combining an output result of an ADC behind the another memory cell array with an output result of the arithmetic operation circuit; and when the data in the buffer is input into the memory cell array, combining an output result of an ADC behind the memory cell array with the output result of an ADC behind the another memory cell array.

7. An electronic device, comprising a memory, a processor, and a computer program stored in the memory and executable on the processor, wherein the processor implements the steps of the neural network weight matrix adjusting method according to claim 1 when executing the program.

* * * * *